US006448109B1

(12) United States Patent
Karpman

(10) Patent No.: US 6,448,109 B1
(45) Date of Patent: Sep. 10, 2002

(54) WAFER LEVEL METHOD OF CAPPING MULTIPLE MEMS ELEMENTS

(75) Inventor: Maurice S. Karpman, Brookline, MA (US)

(73) Assignee: Analog Devices, Inc., Norwood, MA (US)

( * ) Notice: Subject to any disclaimer, the term of this patent is extended or adjusted under 35 U.S.C. 154(b) by 50 days.

(21) Appl. No.: 09/713,693

(22) Filed: Nov. 15, 2000

(51) Int. Cl.[7] ............................................... H01L 21/44
(52) U.S. Cl. ........................... 438/108; 438/51; 438/55; 438/455; 438/458; 156/182; 156/299
(58) Field of Search .................................. 156/182, 299, 156/300; 438/51, 55, 108, 113–127, 455–459, 462, 464

(56) References Cited

U.S. PATENT DOCUMENTS 5,824,186 A  * 10/1998  Smith et al. .................... 216/2
6,297,072 B1 * 10/2001  Tilmans et al. ............. 438/106

OTHER PUBLICATIONS

F. Mayer, O. Paul, and H. Baltes, "Flip–Chip Packaging for Thermal CMOS Anemometers", Proc. IEEE Microelectromechanical Systems, Jan. 26–30, 1997, pp. 203–208.

* cited by examiner

*Primary Examiner*—George Fourson
*Assistant Examiner*—Thanh V Pham
(74) *Attorney, Agent, or Firm*—Koppel, Jacobs, Patrick & Heybl

(57) ABSTRACT

Individual caps are provided for mutually spaced MEMS on a common wafer by establishing a fixed spatial array of caps in positions that correspond to the positions of the MEMS on the wafer, and simultaneously bonding the caps to corresponding MEMS. The caps are preferably held in place within recesses in a template, and include protective sealing rings that are bonded to the MEMS wafer. The wafer is diced into individual MEMS chips after the caps have been bonded. The caps can be provided with circuitry that faces away from MEMS wafer and is wire bonded to the wafer, or that faces towards the wafer with a flip-chip mounting.

16 Claims, 2 Drawing Sheets

WAFER LEVEL METHOD OF CAPPING MULTIPLE MEMS ELEMENTS

BACKGROUND OF THE INVENTION

1. Field of the Invention

This invention relates to the provision of protective caps on microelectromechanical systems (MEMS), and more particularly to capping multiple MEMS that are provided on a common wafer.

2. Description of the Related Art

MEMS, also referred to as micromachines or micro systems, are complete units that contain both electrical and mechanical microstructures with characteristic sizes generally ranging from nanometers to millimeters. They evolved from the photolithographic techniques used to fabricate integrated circuits, and therefore are very small in size and capable of being manufactured in large, inexpensive quantities. Multiple MEMS are typically fabricated on a common semiconductor wafer, in a manner analogous to integrated circuits. They have numerous applications in fields such as physics, chemistry, engineering, biology and medicine.

It is generally necessary to provide a protective cap on a MEMS element. Without protective caps, malfunctions can result from moisture entering the MEMS cavity, and the devices are subject to outgasing and contamination problems.

One approach to capping has been to provide rings of glass or solder paste on a cap wafer that is ultimately diced along with the MEMS wafer into individual chips. The rings form a protective seal around each MEMS when the cap wafer is bonded to the MEMS wafer. However, electrode pads to which electrical wires can be bonded to provide electrical access to the MEMS are also typically provided on the surface of the MEMS wafer. To access these pads after the cap wafer has been put in place, holes have been etched into the cap wafer prior to bonding it to the MEMS wafer. Alternately, access openings in the cap wafer can be partially etched from one side of the wafer prior to bonding to the MEMS wafer, followed by back grinding the opposite side of the cap wafer after bonding to complete the openings. Once the cap wafer has been put in place and the access openings are completed, the joined wafers are diced into individual parts.

A problem with etching access openings all the way through the cap wafer, prior to bonding, is that it makes the cap fragile and subject to breakage, while partially pre-etching the cap wafer and then back grinding after the capping is completed takes a long time. The problem is aggravated for MEMS which include electrical circuitry on the MEMS wafer, in which case there is often also a need to access trimming pads as well as wire bond pads. Furthermore, if there are imperfections in one or more of the seal rings on the cap wafer, its associated MEMS will not be adequately sealed and will have to be discarded along with the cap, reducing the manufacturing yield.

Another problem is that, if the MEMS and cap wafers are formed from different materials with a significant differential between their thermal coefficients of expansion, the relatively high bonding temperatures can result in excessive material strains.

Caps that include active circuitry have also been diced and then bonded one-at-a-time onto respective MEMS of the MEMS wafer. The bonding is accomplished with a "flip-chip" technique in which conductive "bumps" connect corresponding pads on the caps and MEMS wafer, with a solder ring seal around each MEMS. An example of this technique is described in Mayer and Paul, "Flip-Chip Packaging for Thermal CMOS Anemometers", Proc. IEEE Microelectromechanical Systems, Jan. 26–30, 1997, pages 203–208. This is a slow, manual process in which there is a high breakage risk, since a force must be applied to hold the cap chips to the MEMS wafer at an elevated temperature for a relatively long period of time. The caps can be difficult to precisely align with the underlying MEMS devices, further reducing yields.

SUMMARY OF THE INVENTION

The invention provides a new method of capping MEMS on a common wafer which reduces the risk of breaking the caps and also the amount of cap material needed, leaves trimming and wire bond pads on the MEMS wafer easily accessible, is quick and inexpensive, provides an improved yield and eliminates the alignment problem previously encountered in bonding discrete cap chips to a MEMS wafer.

These improvements are achieved with a new MEMS capping method in which a fixed spatial array of discrete, mutually spaced caps is established for a plurality of MEMS on a common wafer, with the caps positioned at locations corresponding to the positions of the MEMS, and then simultaneously bonding the caps to corresponding MEMS on the wafer. The caps are positioned in the array by a common cap holder that preferably comprises a template with an array of recesses for individual caps. Once bonding has been completed, the wafer is diced into individual MEMS chips.

Protective ring seals are provided on the caps before they are bonded to the MEMS wafer. This allows the caps and ring seals to be inspected individually, with any caps that do not pass the inspection discarded prior to bonding. The method is applicable to both flip-chip bonded caps, and caps that either have no active circuitry or that include circuitry that faces away from the MEMS and is wire bonded to the MEMS wafer. To facilitate a rapid placement of caps in their respective template recesses, while still aligning them accurately with their respective MEMS, the side walls of the recesses can be sloped outwards.

These and other features and advantages of the invention will be apparent to those skilled in the art, taken together with the accompanying drawings, in which:

DETAILED DESCRIPTION OF THE INVENTION

Figure 1:
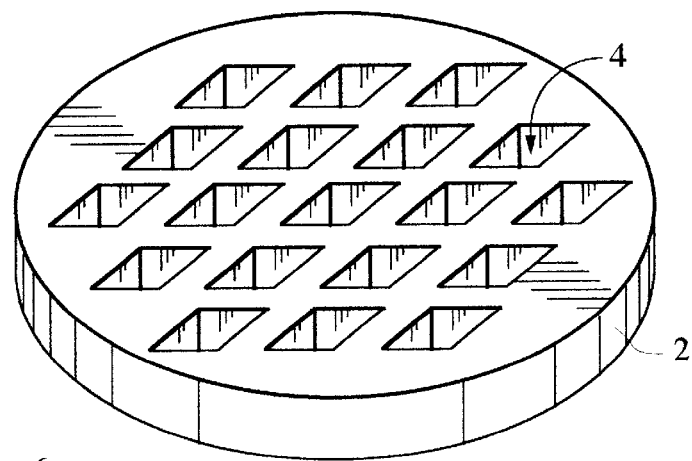
FIG. 1 is a perspective view of a template for establishing a fixed spatial array of MEMS caps.

A rapid and efficient capping of MEMS devices is made possible in accordance with the invention through the use of a template 2, illustrated in FIG. 1, that includes an array of recesses 4 extending into one of its major surfaces. The template is preferably formed from a silicon wafer that is patterned and etched, using bulk micromachining techniques, so that the recesses 4 extend partially into the wafer. The spacing between recesses corresponds to the spacing of MEMS elements on a MEMS wafer.

Figure 2:
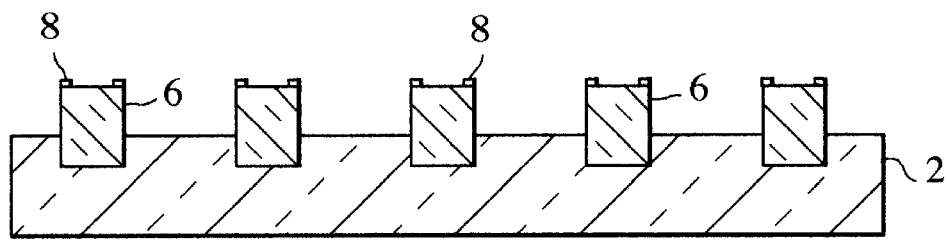
FIG. 2 is a sectional elevation view of MEMS caps positioned in a template in accordance with the invention.

As illustrated in FIG. 2, MEMS caps 6 are placed into the recesses 4, which are slightly larger in size than the caps so that the caps can be easily inserted and removed, but have little room for movement within the recesses.

The caps 6 can be formed from numerous different materials, such as silicon, glass, germanium or gallium phosphide. When used for square MEMS chips that are typically 2 mm on a side, the cap wafer is diced into individual caps that are preferably about 1 mm on a side. As explained below, this avoids excessive strain during high temperature processing when there is a significant difference between the thermal coefficients of expansion for the caps and the MEMS wafer.

Figure 3:
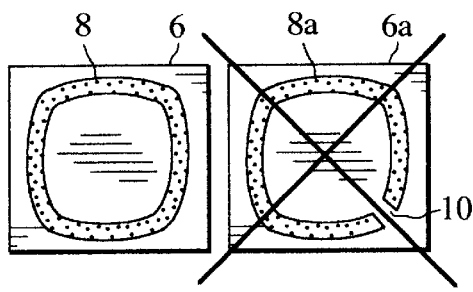
FIG. 3 is a plan view of two caps, one of which has a defective sealing ring.

Referring now to FIGS. 2 and 3, seal rings 8 are provided on the caps, preferably when they are still in a wafer state prior to dicing into individual caps. The seal rings can be formed from a glass frit that is patterned onto the cap wafer. Alternately, when the caps are to be flip-chip mounted onto a MEMS wafer, the seal rings can be formed from screen printed solder. The glass frit is fired prior to dicing, typically at about 300° C. for a half hour to burn out organics, and then at about 400° C. (just below the melting temperature) for another half hour.

The tolerance in dicing a nominally 1 mm cap is typically 12 micrometers. Accordingly, the recesses 4 are preferably 1.012 mm wide to accommodate the cap tolerance. Since misalignments up to about 25–40 micrometers between the cap and the its MEMS element can be tolerated, slight misalignments due to the cap being smaller than its recess are not harmful.

After dicing, the individual caps 6 are picked and placed into respective template recesses with the seal rings 8 facing upward, away from the template. For caps having equal thicknesses, the recesses have equal depths so that the seal rings on the array of caps are coplanar. One advantage of dicing the caps prior to bonding them to the MEMS wafer is that it allows the individual caps to be inspected prior to bonding. Bad caps, such as the cap 6a in FIG. 3 with a defect 10 in its seal ring 8x, can thus be discarded without wasting a MEMS element.

Figure 4:
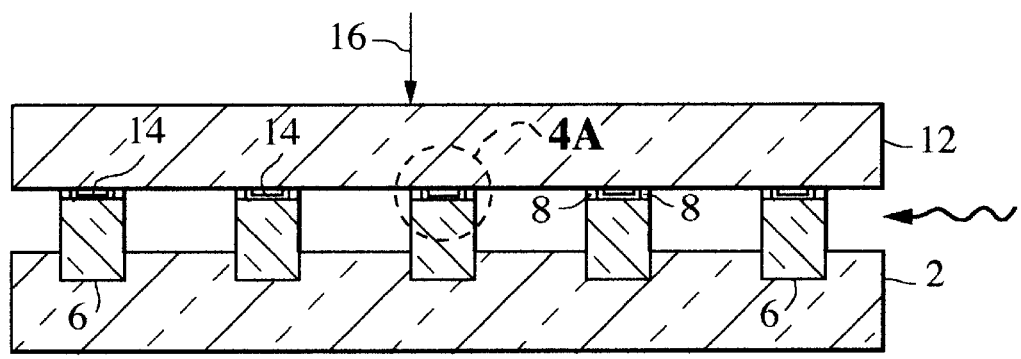
FIGS. 4 and 5 are sectional elevation views of sequential steps in the process of capping discrete MEMS chips.
Figure 4A:
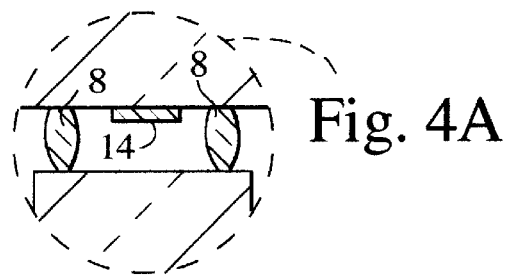
FIG. 4A is an enlargement of the area 4A in FIG. 4.
Figure 5:
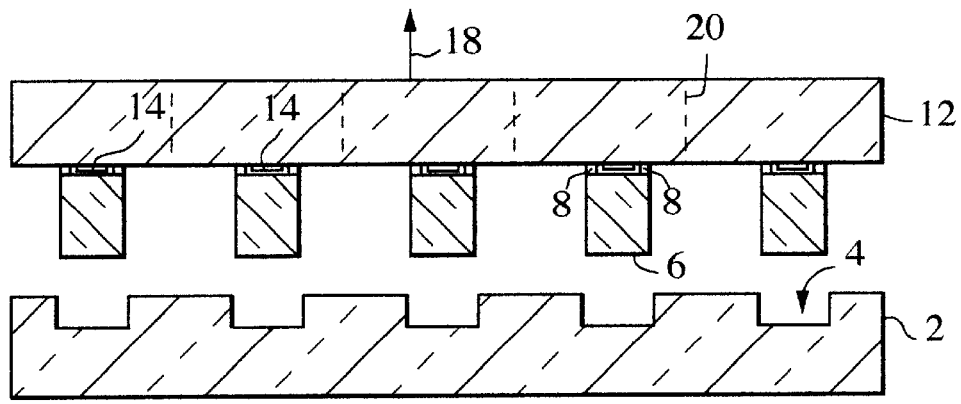

In the next step, illustrated in FIGS. 4 and 4A, a MEMS wafer 12, upon which an array of MEMS elements 14 have been fabricated, is placed over the caps in the template 2 so that the MEMS elements 14 are aligned inside the seal rings 8 of respective caps. The drawings are not to scale, and the MEMs elements 14 would typically be thinner than shown. The MEMS wafer is pressed down over the caps, indicated by force arrow 16, and the caps are bonded via their seal rings to the MEMS wafer outside the MEMS elements. The bonding is typically performed at about 400°–450° C. for a glass frit, and at about 280°14 320° C. for solder. Since the MEMS wafer contacts all of the seal rings, all of the caps are bonded to the wafer simultaneously in a single bonding step.

Figure 6:
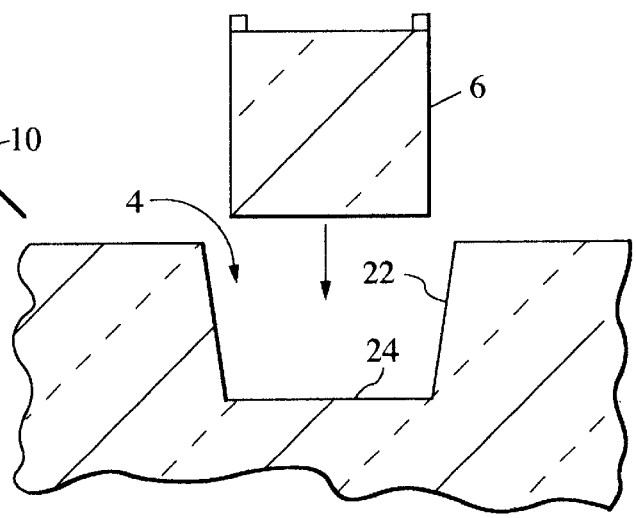
FIG. 6 is a sectional elevation view of a shaped recess in the template, in relation to a MEMS chip which it holds.

When the bonding has been completed, the MEMS wafer 12 is raised upward (indicated by arrow 18), lifting the attached caps 6 out of the template 2. At this point the MEMS elements 14 are protected from the environment by the caps 6 and the surrounding seal rings 8. The MEMS wafer is then diced into individual completed MEMS chips, along the dice lines 20. Dicing is typically performed by placing the wafer on a tape and sawing from the cap side To reduce the accuracy required in aligning the caps over the template for insertion into the recesses 4, the side walls 22 of the recesses can be sloped outwards as illustrated in FIG. 6. The recess floor 24 is dimensioned to hold the cap within the necessary alignment tolerance, while its opening is wider to permit greater misalignments in initially placing the cap within the recess.

Figure 7:
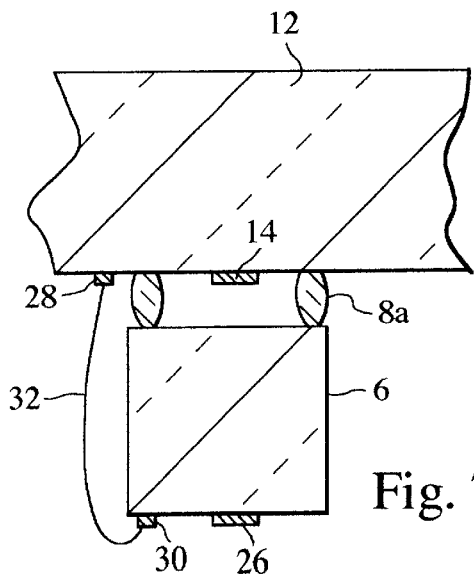
FIGS. 7 and 8 are elevation views illustrating a MEMS cap sealing a MEMS device with electrical connections between the cap and wafer made by wire bonding and flip-chip mounting, respectively.

Caps that are void of circuitry are useful for MEMS in which the necessary circuitry is integrated with the MEMS element on the MEMS wafer. Active circuitry can also be provided on the cap. One way to implement this, illustrated in FIG. 7, is to provide the circuitry 26 on the side of the cap 6 which faces away from the MEMS wafer 12. Six to eight contact pads 28 are typically distributed around the periphery of the MEMS element 14. The cap 6 is sized so that it leaves the MEMS contact pads 28 exposed. Corresponding contact pads 30 are provided around the cap logic circuitry 26, with lead wires 32 wire bonded between corresponding MEMS and cap pads. FIG. 7 shows a completed MEMS chip after dicing, although the wire bonding is preferably performed at the wafer level before dicing.

The surface of the MEMS wafer 12 is typically passivated with a dielectric such as SiN or SiO. A glass frit will wet to the passivation layer, so a glass frit sealing ring 8a need be provided only on the cap to produce a bond between the cap and MEMS wafer. The contact pads on both the MEMS wafer and caps are typically deposited by sputtering or evaporation, to a thickness of a few thousand Angstroms; the sealing ring is much thicker.

Figure 8:
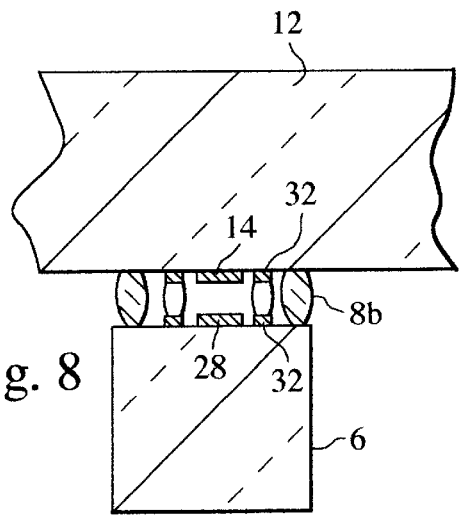

The caps can also be flip-chip bonded to the MEMS wafer, as illustrated in FIG. 8. In this case the cap circuitry 28 is on the side of the cap facing the MEMS wafer 12. Solder is printed on both the cap and the MEMS wafer typically to a thickness of about 10–15 micrometers, at the desired locations for the seal ring 8b and the "bump" connections between facing contact pads 32 on the cap and MEMS wafer. The solder on the cap and MEMS wafer comes together and spreads during bonding, but is limited to the original solder print areas since the solder does not wet the passivation on the opposed surfaces. As with a glass frit, the solder ring 8b together with the cap 6 forms a secure environmental seal for the MEMS element.

The electrical signal levels produced by MEMS are typically quite small. Thus, while wire bonding leaves the capped circuitry exposed for laser trimming if desired, the avoidance of wire bonds through the use of flip-chip mounting reduces parasitics, noise and losses, and thereby allows for an improved circuit performance. Although the circuitry is not exposed with flip-chip mounting, programmable e-proms are typically used for trimming, rather than laser techniques.

One of the advantages of the invention is that the cap wafer is diced into individual caps before bonding to the MEMS element, rather than afterwards. With typical 15 cm (6 inch) wafers, the materials used for the caps and the MEMS wafer could have differentials in thermal coefficients of expansion that would cause excessive strains in the materials at the elevated bonding temperature if a single continuous cap wafer were bonded to the MEMS wafer. Dicing the cap wafer into individual caps before bonding them to the MEMS wafer eliminates this problem. Materials such as glass, germanium and gallium phosphide, which have good IR transparency, can thus be used in caps with a silicon MEMS wafer.

While specific embodiments of the invention have been shown and described, numerous variations and alternate embodiments will occur those skilled in the art. For example, alternates to the described template can be envisioned to hold the discrete, mutually spaced caps in a fixed spatial array for bonding to the MEMS wafer. These include the use of mounting tape (although available tapes do not maintain dimensional stability at high bonding temperatures), vacuum devices to hold the caps in place (although it could be difficult to maintain alignment during bonding), and a continuous array of caps, some of which are "virtual" caps that lack seal rings and simply serve as spacers to correctly position the real caps, without bonding to the MEMS wafer. Accordingly, it is intended that the invention be limited only in terms of the appended claims.

I claim:

1. A method of capping a plurality of mutually spaced microelectromechanical systems (MEMS) on a common wafer, comprising:
    establishing a fixed spatial array of discrete, mutually spaced caps for said MEMS, with the caps positioned within the array at locations corresponding to the positions of said MEMS on said wafer, and
    simultaneously bonding said caps to said wafer to cap corresponding ones of said MEMS.

2. The method of claim 1, wherein said caps are removeably positioned in said array by a common cap holder.

3. The method of claim 2, wherein said cap holder comprises a template with an array of recesses for holding respective caps.

4. The method of claim 3, wherein said recesses have depths that cause said caps to be substantially coplanar.

5. The method of claim 1, wherein said caps are bonded to said MEMS with protective ring seals.

6. The method of claim 5, wherein said caps are bonded to said MEMS by applying ring seals to a plurality of caps, inspecting said caps and ring seals, and bonding only caps which pass said inspection over said MEMS.

7. The method of claim 1, further comprising the step of dicing said wafer into individual MEMS chips after said caps have been bonded.

8. The method of claim 1, said caps and wafer having different thermal coefficients of expansion, wherein said caps are bonded to said MEMs at a temperature that would be high enough to cause excessive strain in the materials used for the caps and common wafer if a single continuous cap wafer were bonded to the common wafer, further comprising the step of processing said wafer after said caps have been bonded.

9. The method of claim 1, wherein electrical circuits for said MEMS are provided on their respective caps, and said caps are flip-chip bonded to said wafer.

10. The method of claim 1, wherein electrical circuits for said MEMS are provided on one side of their respective caps, contact pads for said circuits are provided on said wafer, said caps are bonded to their respective MEMS with their circuit sides facing away from said wafer, and said contact pads are thereafter wire bonded to said circuits.

11. A method of capping a plurality of mutually spaced microelectromechanical systems (MEMS) on a common wafer, comprising:
    providing a cap template having an array of mutually spaced recesses sized to removeably retain caps of a desired size for said MEMS,
    placing individual caps for respective ones of said MEMS in respective recesses of said array,
    positioning said wafer with respect to said array so that said caps are aligned with their respective MEMS,
    bonding said caps in said template recesses to said wafer to form protective seals around their respective MEMS,
    removing said caps from said recesses, and
    dicing said wafer into individual MEMS chips.

12. The method of claim 11, wherein said recesses have side walls that are sloped outwards to facilitate placement of said caps in their respective recesses.

13. The method of claim 11, wherein ring seals are formed on said caps, said caps and ring seals are inspected, and only those caps which pass said inspection are bonded to said wafer, with said ring seals forming said protective seals.

14. The method of claim 11, wherein said caps are originally provided as a common cap wafer, ring seals are formed on said caps in their wafer state, said cap wafer is thereafter diced into said individual caps, and said ring seals form said protective seals when said caps are bonded to said MEMS wafer.

15. The method of claim 11, wherein electrical circuits for said MEMS are provided on their respective caps, and said caps are flip-chip bonded to said wafer.

16. The method of claim 11, wherein electrical circuits for said MEMS are provided on one side of their respective caps, contact pads for said circuits are provided on said wafer, said caps are bonded to their respective MEMS with their circuit sides facing away from said wafer, and said contact pads are thereafter wire bonded to said circuits.

* * * * *